United States Patent [19]

Murr et al.

[11] Patent Number: 5,089,467
[45] Date of Patent: Feb. 18, 1992

[54] SUPERCONDUCTOR STRUCTURES AND METHOD OF FORMING SAME

[75] Inventors: Lawrence E. Murr, Tigard, Oreg.; Alan W. Hare, Port Angeles, Wash.

[73] Assignees: Oregon Graduate Center, Beaverton, Oreg.; Northwest Technical Industries, Inc., Sequim, Wash. ; a part interest

[21] Appl. No.: 363,909

[22] PCT Filed: Jul. 29, 1987

[86] PCT No.: PCT/US87/01851
§ 371 Date: May 15, 1989
§ 102(e) Date: May 15, 1989

[87] PCT Pub. No.: WO89/01240
PCT Pub. Date: Feb. 9, 1989

[51] Int. Cl.$^5$ .............................. B32B 9/00
[52] U.S. Cl. ........................ 505/1; 505/701; 505/702; 505/703; 505/704; 428/457; 428/688; 428/901; 428/930; 427/62; 228/107; 65/3.12; 423/344

[58] Field of Search ............... 505/1, 701–704; 427/62, 96; 29/599; 428/209, 323, 426, 432, 457, 688, 901, 930; 228/107; 65/3.12; 423/344

[56] References Cited

U.S. PATENT DOCUMENTS 4,717,627 1/1988 Nellis et al. ............... 428/552
4,778,500 10/1988 Ronn et al. ............... 423/344
4,826,808 5/1989 Yurek et al. ............... 505/1

Primary Examiner—Patrick J. Ryan
Attorney, Agent, or Firm—Kolisch, Hartwell, Dickinson, McCormack & Heuser

[57] ABSTRACT

Superconductive structures and a method of forming the same wherein an assembled mass (12) of superconductive particles, or of a mixture of superconductive particles and particles having other properties, are formed into a desired confined configuration and consolidated into a rigid useful unitized body through shock-wave treatment performed at relatively lower temperatures.

15 Claims, 3 Drawing Sheets

SUPERCONDUCTOR STRUCTURES AND METHOD OF FORMING SAME

TECHNICAL FIELD

This invention relates to the field of ceramic-metal materials (processes and products), and specifically to the formation of superconductive materials into usable fixtures, or structures, by bonding of particles having superconductive properties through the application of shock-wave treatment at relatively low temperatures.

BACKGROUND ART

Superconduction may be defined as the conduction of a current in a material without electrical resistance. Another definition of superconduction is the exhibition of the so-called Meissner effect wherein an external magnetic field is repelled by a material operating in a superconductive state.

The phenomenon of superconductivity was initially discovered by K. Onnes in 1911. The nearly resistance-free conduction of a current in liquid mercury, cooled with liquid helium, was observed. In 1933, Meissner discovered the magnetic phenomena, which bear his name, of superconductors.

In early 1986, J. G. Bednorz and K. A. Müller released their findings following several years of experimentation with oxide-containing superconductors of the perovskite-like and spinel-like structures. These materials, containing lanthanum, barium and copper oxide, exhibit superconductive properties at a temperature of about 30° K. F. M. Mueller, *Breakthroughs in Superconductivity*, Journal of Metals, May 1987, Pages 6-8.

Dr. Paul Chu, also in early 1986, disclosed research indicating that the compound $YBA_2CU_3O_x$, where x is approximately 7, exhibits superconductive properties at temperatures which may be achieved by cooling with liquid nitrogen. Additional compounds have been disclosed which include rare earth elements mixed with cuprate oxides, and rare earth elements mixed with barium cuprate oxides. F. Fletcher, *Developments in Superconductivity-High $T_c$ Oxides*, Journal of Metals, May 1987, Pages 9-11.

The primary problem associated with the ceramic-metal superconductors is that they are not machinable, castable, or otherwise workable by conventional techniques. The ceramic-metals, when combined with certain elements, generally rare earth elements, form compounds which exhibit superconductive properties at about 87° K. These compounds, which are generally referred to as cuprate oxides, are neither ductile, weldable, solderable, nor workable by conventional techniques. Further, the compounds tend to decompose when exposed to water or water vapor, and are highly oxidizing to other materials with which they come into contact.

Although it may be possible to form superconductive particles into a desired configuration, and then sinter the mass, sintering at a temperature sufficient to congeal the mass into a solid body seriously degrades or destroys the superconductive properties of the material.

In an attempt to form a cuprate oxide into a usable form, researchers at AT&T Bell Labs disclosed a flexible tape containing unfired Y-Ba-Cu-O superconducting oxide.

Numerous other reports of developments in superconductivity have appeared, for example, in High Technology, July, 1987, Business Week, Apr. 6, 1987, The Wall Street Journal, July 9, 1987, and the New York Times, July 3, 1987 and July 7, 1987. A common theme throughout these numerous publications has been the inability of the various researchers to work current, "high-temperature" superconductive materials into usable fixtures or structures. Although the materials have been formed into buttons and ribbons, no technique has been disclosed for forming these materials into a usable shape, for fastening the material to a conventional wire or electrical bus, or for manufacturing any useful object from the materials.

DISCLOSURE OF THE INVENTION

As previously noted, materials are now known which have superconductive properties at temperatures well above 0° K. These materials, generally referred to as cuprate oxides, are not workable by conventional machining or molding techniques.

The method of the instant invention teaches a surprisingly successful technique for forming a superconductive structure, from an assembled mass of discrete particles having superconductive properties, into a wide variety of practical useful, predetermined configurations. In each such configuration, the particles in the assembled mass are consolidated by shock-wave treatment thereby to bond them as a unit to form an integral, rigid body having the desired predetermined configuration.

Other problems with cuprate oxides are their inability to be attached, as by soldering, brazing or welding, to another material, their lack of ductility, and their non-machinability.

The method of the present invention teaches, in addition, a technique for forming a superconductive structure wherein a mass of particles having superconductive properties is mixed with another mass of particles having ductile and/or conductive properties. This composite mass is then formed into a desired predetermined configuration, and consolidated by shock-wave treatment, to form a solid, ductile and/or conductive structure having the desired configuration. The introduction of ductile, conductive particles, results, finally, in a wettable structure which may be soldered, brazed or welded by conventional techniques. It may also be worked conventionally, as by machining and drawing.

Other types of particles, having any preselected, desired properties, may also be introduced into the assembled mass, thereby creating a structure having superconductive properties and properties of the other particles.

Continuing, because cuprate oxides tend to decompose in the presence of moisture, structures formed from cuprate oxide compounds generally should be shielded from moisture. The method of the invention teaches, further, a technique for forming an assembled mass of discrete particles of the material into a predetermined configuration wherein the assembled mass is encapsulated in a substrate to protect it from moisture.

On another point, cuprate oxides will readily oxidize materials which they come in contact with in the presence of heat. Conventional, heat-producing bonding techniques are therefore not usable with cuprate oxides and other materials. The method of the instant invention teaches a process for bonding cuprate oxides with materials which are used as substrates for the chosen configurations which does not utilize heat sufficient to oxidize the substrate material.

BEST MODE FOR CARRYING OUT THE INVENTION

Figure 1:
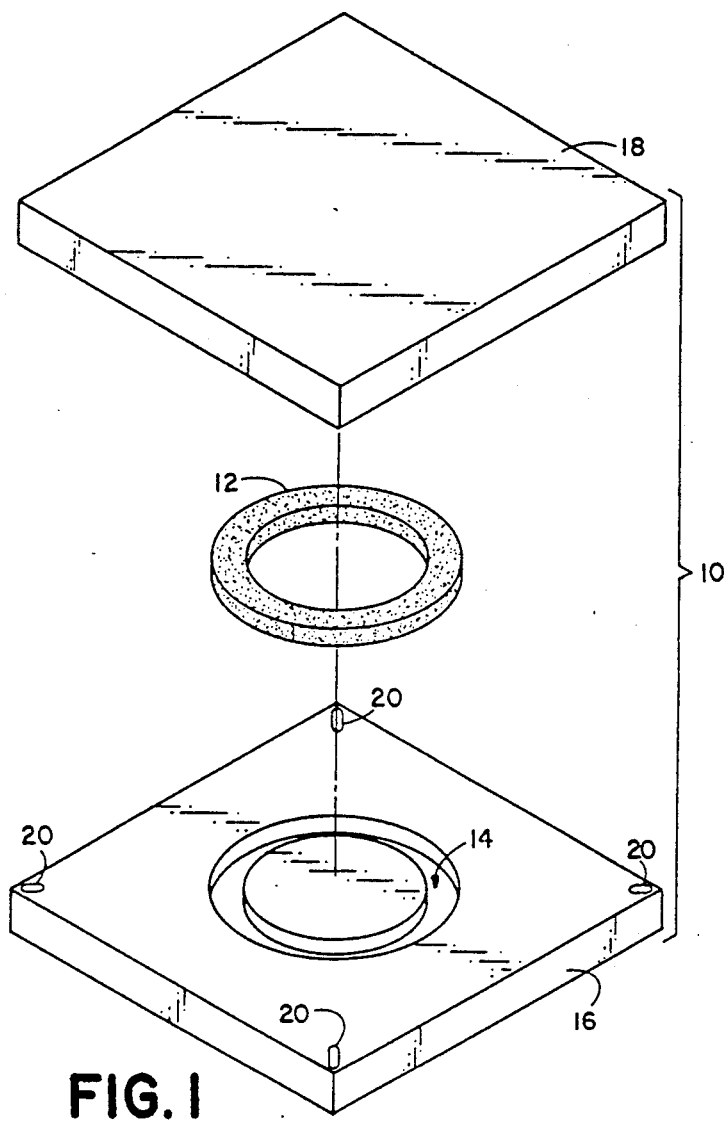
FIG. 1 is an exploded view of elements used in a preferred method of practicing the invention.

Referring now to the drawings, and initially to FIG. 1, a number of elements are depicted generally at 10 which are used in a preferred method of practicing the invention, and in forming a useful superconductive structure according to the invention. While, as will be explained, a practical superconducting structure can be created with any desired shape, we have chosen to illustrate, in FIG. 1, the making of an annular superconducting ring which can be used as an energy-storage ring. As will become apparent, the dimensions of this ring are a matter of choice.

Explaining now more particularly what is illustrated, a mass of particles 12, which have superconductive properties, is assembled into a predetermined configuration (ring) by placing the particles in an annular void space, or void 14, of the desired dimensions suitably formed in a substrate 16.

Substrate 16 may be made of virtually any material, and may be a conductor or an insulator. Copper has been found to be a particularly suitable substrate because of its ductility and the ease with which it may be machined, as well as because of its excellent heat-conducting properties.

The superconductive particles which make up mass 12 may be of any chosen composition, inasmuch as the practice of this invention is material independent. One particular type of compound with which the invention has been,, practiced is defined by the formula $La_{2-z}Ba_z$-$CuO_4$ where $z=1$ or 2. Other superconductive compounds may be used, and as will be explained later herein, these superconductive compounds may be mixed with non-superconductive materials, or compounds, having various preselected properties, other, for example, than, or in addition to, ductility and/or conventional electrical conductivity. As used herein, ductility means a ductal property which is greater than that of the high $T_c$ superconductor materials described herein.

Substrate 16, with mass 12 assembled in void 14, is then covered with a layer 18, which again, may be made of any suitable material, conductive or insulative, and which, in the preferred method now being described, is a flat plate of copper.

Figure 2:
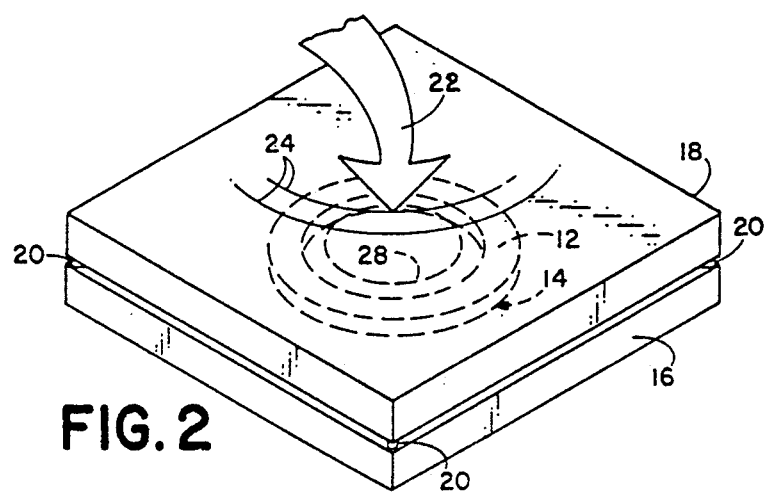
FIG. 2, which is directly related to FIG. 1, illustrates the consolidation of superconductive particles into one, predetermined, chosen configuration.

Referring to FIG. 2 along with FIG. 1, elements 10 of FIG. 1 have been brought together in a condition ready for consolidation. Spacers 20 are provided as shown at the corners of substrate 16 and layer 18 to maintain layer 18 a slight distance from the upper surface of substrate 16. Preferably, spacers 20 are formed of 10-gauge aluminum wire, providing a spacing of approximately 3.2-mm between substrate 16 and layer 18.

The elements, assembled as shown in FIG. 2, are then subjected to a shock wave which is represented in this figure by arrow 22 and by wave-front lines 24. This shock wave may be furnished by a variety of techniques, including the conventional technique of employing external explosive material. For example, an appropriate external explosion may be created by the ignition of a mixture of ammonium nitrate, fuel oil and perlite. Other forms of explosives may, of course, be used as well. Non-explosive shock-wave creation may occur through the use of a high-powered laser, or by other known high-percussive techniques.

Experience has shown that, with respect to an assemblage like that shown in FIG. 2, and with substrate 16 and layer 18 formed of copper and having lateral dimensions of up to about 10-inches, an appropriate shock wave is one which is characterized by the speed of approximately 1800- to 3000-meters/second. This has also been found to be true where substrate 16 and layer 18 have been formed of other materials, such as, for example, aluminum. As used herein, the term "shock wave" refers to a compressional wave which forms whenever the speed of a body of fluid, relative to a medium, exceeds the speed at which that medium can transmit sound.

Following shock-wave treatment, the particles in mass 12 are consolidated implosively into a solid body, and are wholly or partially bonded integrally with the material in substrate 16 and layer 18. With respect to the particles in mass 12, the term "consolidation" as used herein refers to a resulting particle-to-particle bond situation where the consolidated structure holds together as a contiguous mass. This term should be distinguished from the term "compaction" sometimes referred to in the treating of a mass of particles. "Compaction" is distinguishable in that it refers to a process wherein treated particles remain discrete, with no bonds formed between the individual particles.

What results from the shock-wave treatment procedure that has just been described is a practical, usable superconductive structure, namely (and in this specific case) a storage ring. The consolidated mass of particles has the finally desired ring configuration, and retains all of the superconductive properties which characterize the individual unconsolidated particles. As will be explained, heating of the particles during shock-wave treatment is minimal, and is well below that level which could result in degrading of superconductive properties. In fact, evidence indicates that shock-wave treatment of the particles in mass 12 appreciably increases what is known in the field of metallurgy as the "density of dislocations" of crystalline elements. The fact that such an increase occurs strongly suggests that shock-wave consolidation of superconductive particles actually produces enhanced superconductive qualities in the finally consolidated structure.

Further, the final contiguous mass can be subjected repeatedly to a shock-wave to create dislocations and related defects and to saturate dislocation or defect densities in the particle mass, and also to strengthen or harden the resulting structure as documented in the metallurgical literature.

The elements shown in FIG. 2, now fully consolidated into a unitary body, may be machined conventionally to form an appropriate, finally usable configuration. For example, the circular area shown at 28 in FIG. 2 may be machined away to hollow the interior of the ring formed by mass 12, without actually exposing the material in the ring. Machining may also be performed to remove material around the perimeter of the ring so that a resulting final structure has the "outside" appearance of a square-cross-section copper ring. As was mentioned earlier, a practical ring structure can be formed with any desired dimensions.

Figure 3:
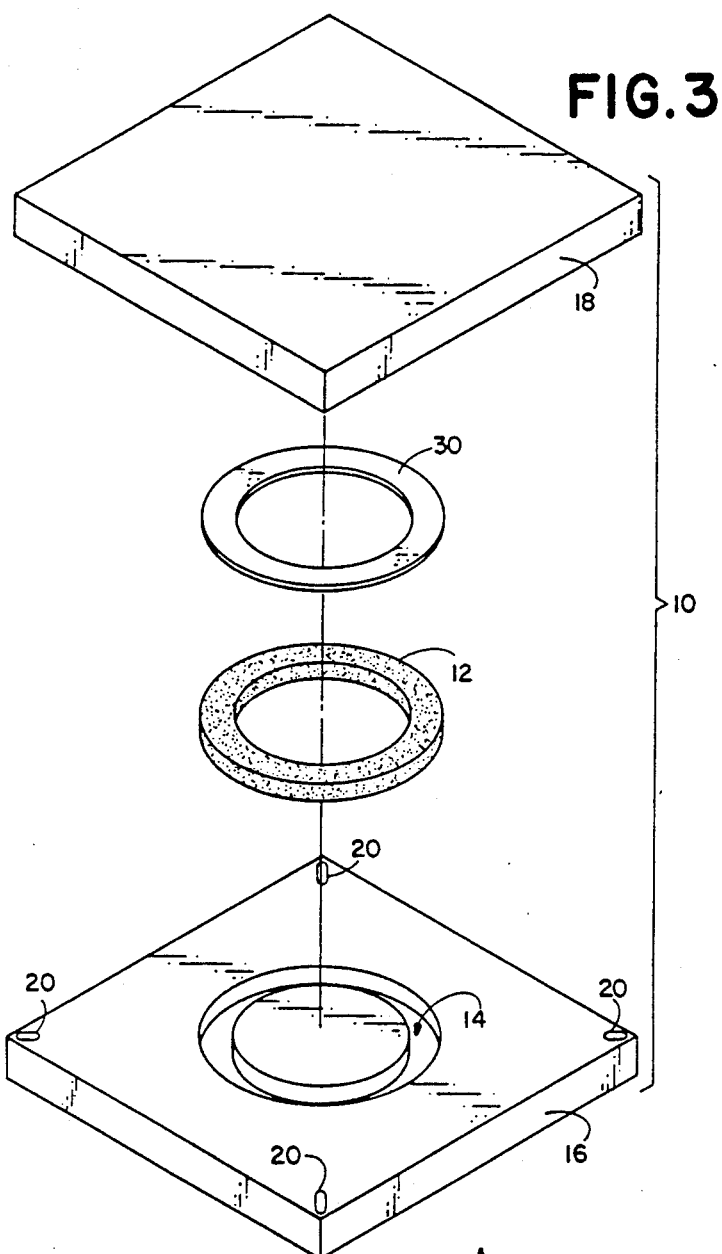
FIG. 3 is an exploded view of elements used in a modified manner of practicing the invention.

Turning now to FIG. 3, elements 10 are again depicted with the addition of a thin retainer 30 which is machined to be conformal with inner and outer diameters of void 14, and to be clearance fittably receivable therein. Retainer 30 may be formed of any suitable material, and, where substrate 16 and layer 18 are made of copper, is preferably formed of the same. Retainer 30 is used to pre-compress mass 12 in void 14. Use of a retainer has been found partially to eliminate adiabatic heating which occurs in the air captured in mass 12 and in void 14 as layer 18 is rapidly forced down onto the upper surface of substrate 16 by shock wave 22. Provision of retainer 30 also allows consolidation of elements 10 in non-horizontal positions, inasmuch as the retainer captures mass 12 in void 14. Once retainer 30 is positioned in void 14, layer 18 is again positioned in proper spaced relationship to substrate 16, with spacers 20 in place, and the elements are subjected to a shock wave.

Figure 4:
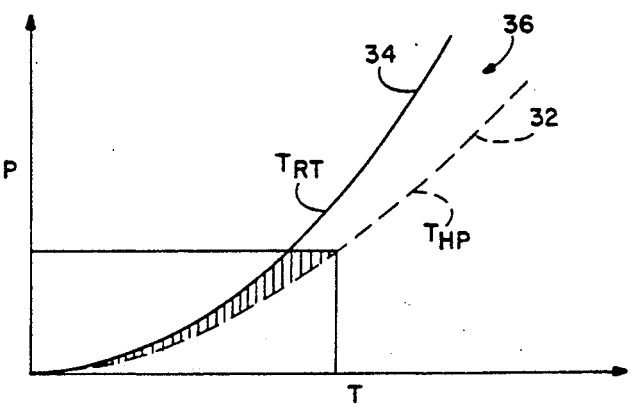
FIG. 4 is a graph illustrating shock heating parameters.

Referring now to FIG. 4, a graph representing shock heating effects is depicted. Shock heating is both pressure and material dependent. The graph represents pressure (P) and temperature (T) on its axes. The temperature of the material in a high-pressure state ($T_{HP}$), line 32, represents the temperature in the material just behind shock front 24. The residual temperature ($T_{RT}$), line 34, represents the measurable temperature to which the material rises following the application of the shock wave. A shock heating region 36 is located in the area between lines 32 and 34.

Typical, initial pressures for explosive shock-wave velocities of 1800-meters/seconds to 3000-meters/seconds are in the range of about 2- to 8-GPa (20- to 80-Kilobars). For metals such as nickel or copper for example, the maximum temperatures in the high pressure state corresponding to these pressures are roughly 75°- to 100° C. (348° K. to 373° K.). At pressures below about 10-GPa, the shock heating region 36 is small. However, during consolidation some additional heating can occur because of particle straining to fill void spaces. This can be reduced by using a distribution of particle sizes to reduce void space.

As previously noted, the superconductive cuprate oxides are highly reactive materials and will, with the appropriate temperature, react with almost any material with which they are in contact. Assuming that elements 10 are initially generally at environmental, or room temperature, the application of a shock wave as described herein will raise $T_{RT}$ to a maximum temperature which is less than 373° K. With such being the case, there is little reaction between the cuprate oxide compound selected, the substrate and the covering layer, and no degrading of superconductive properties.

As previously noted, one of the shortcomings of the cuprate oxide superconductive compounds is their lack of ductility and wettability, i.e., the ability to be soldered, brazed or welded-to using conventional techniques. These drawbacks can be negated by the introduction of a second mass of particles, having ductile and/or conductive properties, and mixing the second mass with a first mass of particles having superconductive properties. One material which has been found to be suitable for this purpose is copper. Copper particles are mixed with superconductive cuprate oxide particles thereby forming an assembled mass of the mixed particles. The second material may be substantially uniformly distributed throughout the superconductive particles, or there may be a non-uniform, or differential, distribution of particles, wherein the concentration of the non-superconductive particles varies, in a predetermined way, throughout the assembled mass. For instance, it may be desirable to have an integral superconductive body having a linear configuration wherein the central portion of the body includes, substantially exclusively, superconductive particles, with the ends of the body containing an enrichment of copper (or other conventionally "wettable") particles. Such a distribution has been shown to make the ends of such a structure readily wettable, i.e., solderable, brazable and weldable by conventional techniques.

Figure 5:
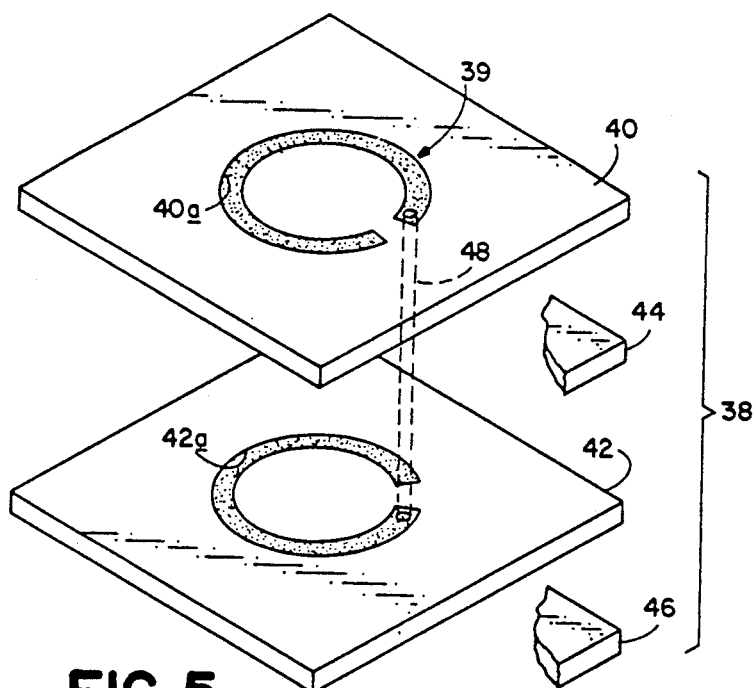
FIG. 5, which is on about the same scale as FIGS. 1 and 2, is a fragmentary, exploded, perspective view illustrating one way of making a multiturn, superconductive coil in accordance with the invention.

Turning attention now to FIG. 5, here there is shown, fragmentarily, generally at 38, a multilayered, laminate superconductor structure, in the form of a multiturn superconductive coil, constructed in accordance with the practice of the invention. In general terms, the coil which is formed (designated 39 in the figure) is prepared, as will be explained, through the use of a plurality of flat, supportive substrates, such as substrates 40, 42, which are preferably formed of a conductive material such as copper, interleaved with substantially matching flat layers of a suitable insulating material—a pair of such layers being shown at 44, 46.

Prepared in each of substrates 40, 42, etc., are nearly complete annular void spaces, such as the spaces shown at 40a, 42a in substrates 40, 42, respectfully. These void spaces are prepared with what might be thought of, from adjacent substrate to adjacent substrate, as a slight angular offset, so that through-connections can be established, as indicated by dashed lines 48 in FIG. 5, to create a continuous superconductive path for all of the turns which are incorporated in the finally configured coil. These between-substrate connections are, of course, accommodated by suitable bore holes, or the like, which extend from one substrate to an adjacent substrate and through the body of the insulative layer placed between the two.

As was true in the case of the discussion provided earlier herein, the dimensions, and number of turns included, in a coil such as coil 39 are a matter of choice.

With the partial annular void spaces and the through-connection bores filled with the appropriate assembled mass of particles, including (if not consisting entirely of) superconductive particles, the entire assembly is implosively consolidated by shock-wave treatment like that described earlier. If desired, post-consolidation machining may be performed to remove excess materials.

Figure 6:
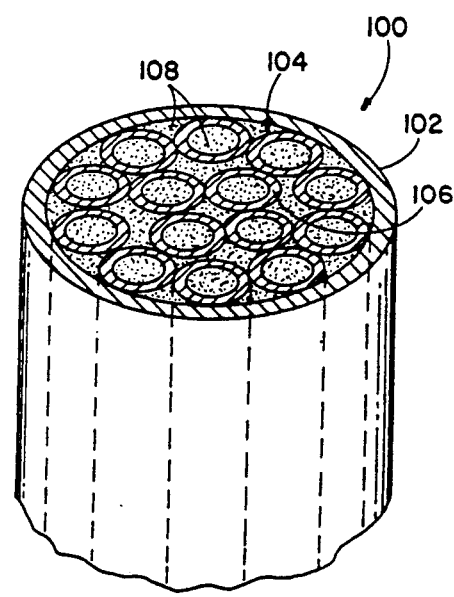
FIG. 6 is a fragmentary, perspective view of a superconductive structure having discrete, ductile, conductive elements included therein.

Turning now to FIG. 6, another superconductive structure is illustrated in a pre-consolidation form, generally at 100. Structure 100 includes a support tube 102 which may be formed of copper, aluminum, etc. Support tube 102 may be filled with an assembled mass of discrete particles containing solely particles having superconductive properties, or containing a mixture as previously discussed. In the particular configuration illustrated, tube 102 has additional tubes inserted therein, such as those tubes illustrated generally at 104, 106. The interiors of the tubes in support tube 102 are filled with discrete particles 108 having superconductive properties, either in pure form or in a mixture with particles having other, preselected properties. Similarly, the space within support tube 102 not occupied by the smaller tubes is likewise filled.

Upon consolidation of particles in the structure by a shock wave, the particles and the tubes become a unitary, integral body having the predetermined configuration and possessing superconductive (and perhaps other chosen) properties. The wall thicknesses of the tubes, the tube sizes, and the mixture distribution of the particles can be varied to produce integral, monolithic products having desired mechanical properties, such as ductility, etc.

Figure 7:
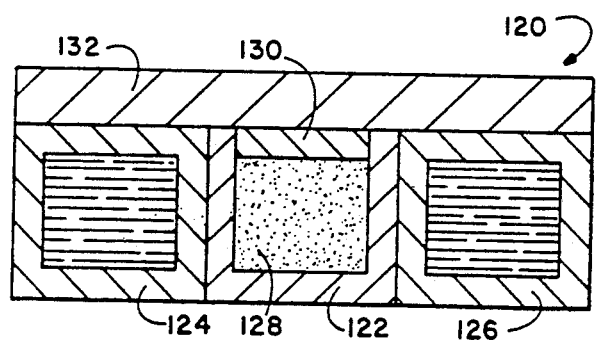
FIG. 7 is a sectional view of a superconductive structure which may be thought of as illustrating, on one hand, a transportation rail structure, and on another hand, an electric power transmission line constructed according to the invention, with cooling conduits formed therein.

Addressing now FIG. 7, a unitary rail structure 120 is depicted which has been fabricated according to the invention. Included is central channel 122 which has a generally U-shaped cross section, formed preferably of a material such as copper, aluminum, etc. As depicted, on opposite sides of channel 122 are conduits 124, 126. A similar conduit may also be placed at the underside of channel 122 or in any other position wherein such conduit is in heat-conducting proximity with the channel. Channel 122 and conduits 124, 126 may be preformed in varying sizes and lengths.

During fabrication, an assembled mass of particles 128 having superconductive properties is placed in the interior of channel 122, a channel-top retainer 130 is used to pre-compress the particles in the channel, and a covering layer 132 is then placed over the entire structure. Thereafter, and by application of a shock wave, the particles in the channel are consolidated, and the entire structure is utilized.

With introduction of a coolant, such as liquid nitrogen, into conduits 124, 126, the superconductive body formed of bonded particles 128 is cooled to below its transition temperature ($T_c$) to place it in a superconductive state. This structure, depicted in FIG. 8, when cooled to a point where particles 128 exhibit superconductive properties, is suitable for use as a mag-lev rail in a transportation system. The channels and conduits can, according to the invention, easily be preassembled at a shock-wave treatment manufacturing facility, taken to the field site, and assembled to form continuous track. Suitable pumping stations can readily be provided to circulate the liquid coolant, and suitable electric connections can be made to enhance magnetic effects.

This same configuration can also serve as a zero-loss conduit for electric power transmission.

Industrial Application

The shock-wave treatment method, and structure formed thereby, according to the invention, therefore, provide a unique, simple, proven, viable way to realize a wide variety of, useful superconductive structures. These structures may be used broadly for the generation and transmission of power. Specifically, these structures, and the method of forming them taught by the invention, greatly facilitate the manufacture of electric generators and motors, offer a realistic way of building electric power storage rings, transmission lines, and track for use with magnetic levitated vehicles, and generally teach important techniques for combining material having superconductive properties with other materials to form usable industrial structures.

The invention is not restricted to the particular embodiments which have been described, since variations may be made therein without departing from the scope of the invention as defined in the appendent claims.

We claim:

1. A superconductive structure comprising: a solid body characterized by the explosive shock-wave consolidation of a mass of particles having high $T_c$ superconductive properties, having increased density of dislocations of crystalline elements, thereby enhancing superconductive qualities.

2. A superconductive structure comprising: a solid body characterized by the explosive shock-wave consolidation of a mixture of particles including particles having high $T_c$ superconductive properties and particles having preselected properties, having increased density of dislocations of crystalline elements, thereby enhancing superconductive qualities.

3. The structure of claim 2, wherein said particles having preselected properties are distributed substantially uniformly throughout the particles having superconductive properties.

4. The structure of claim 2, wherein said particles having preselected properties have a differential distribution throughout the particles having superconductive properties.

5. A superconductive structure comprising: a solid body characterized by the explosive shock-wave consolidation of a mixture of discrete particles including particles having high $T_c$ superconductive properties, wherein the particles having high $T_c$ superconductive properties are cuprate oxide compounds including elements selected from the group consisting of Yttrium, Barium, Lanthanum and Strontium and particles having ductile, electrically conductive properties taken from the group consisting of aluminum or copper, wherein the density of dislocations of crystalline elements in the high $T_c$ particles are increased, thereby enhancing superconductive qualities.

6. The structure of claim 5, wherein said ductile, electrically conductive particles are distributed substantially uniformly throughout the particles having superconductive properties.

7. The structure of claim 5, wherein said ductile, electrically conductive particles have a differential distribution throughout the particles having superconductive properties.

8. A superconductive structure comprising: a solid body characterized by the explosive shock-wave consolidation of a discrete element having preselected properties taken from the group consisting of aluminum or copper and a mass of particles having high $T_c$ superconductive properties, whereby the density of dislocation of crystalline elements in the high $T_c$ particles are increased as the result of the explosive shock-wave consolidation of the discrete element and the particles, thereby enhancing superconductive qualities of the consolidated body, wherein the particles having high $T_c$ superconductive properties are cuprate oxide compounds including elements selected from the group consisting of Yttrium, Barium, Lanthanum and Strontium.

9. A superconductive structure comprising: a solid body characterized by the shock-wave consolidation of a discrete ductile, electronically conductive element and a mass of particles having high $T_c$ superconductive properties, wherein the high $T_c$ particles are characterized by an increased density of dislocation of crystalline elements therein, as a result of the shock-wave consolidation, thereby enhancing superconductive qualities.

10. A superconductive structure comprising: a solid body characterized by the explosive shock-wave consolidation of a discrete element having preselected properties taken from the group consisting of aluminum and copper, and a mixture of particles including particles having high $T_c$ superconductive properties, wherein the particles having high $T_c$ superconductive properties are characterized by an increase in the density of dislocation of crystalline elements therein as a result of the explosive shock-wave consolidation and wherein such high $T_c$ superconductive particles are cuprate oxide compounds including elements selected from the group consisting of Yttrium, Barium, Lanthanum and Strontium and particles having preselected properties.

11. The structure of claim 10, wherein said particles having said preselected properties are distributed substantially uniformly throughout said particles having superconductive properties.

12. The structure of claim 10, wherein the particles having said preselected properties have a differential distribution in the mixture of superconductive particles.

13. A superconductive structure comprising: a solid body characterized by the explosive shock-wave consolidation of a discrete, electrically conductive element, and a mixture of particles taken from the group consisting of Al or Cu including particles having high $T_c$ superconductive properties, wherein the particles having high $T_c$ superconductive properties are cuprate oxide compounds including elements selected from the group consisting of Yttrium, Barium, Lanthanum and Strontium and particles having ductile, electrically conductive properties taken from the group consisting of aluminum or copper, wherein the high $T_c$ particles are characterized by an increase in the density of dislocation of crystalline elements therein as a result of the explosive shock-wave consolidation thereof, thereby enhancing superconductive qualities.

14. The structure of claim 13, wherein said ductile, conductive particles are distributed substantially uniformly throughout the particles having superconductive properties.

15. The structure of claim 13, wherein said ductile, conductive particles have a differential distribution throughout said particles having superconductive properties.

* * * * *